US012328881B2

(12) United States Patent
Kuo

(10) Patent No.: US 12,328,881 B2
(45) Date of Patent: Jun. 10, 2025

(54) DEFORMATION-RESISTANT DEEP TRENCH CAPACITOR STRUCTURE AND METHODS OF FORMING THE SAME

(71) Applicant: Taiwan Semiconductor Manufacturing Company Limited, Hsinchu (TW)

(72) Inventor: Fu-Chiang Kuo, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 958 days.

(21) Appl. No.: 17/458,984

(22) Filed: Aug. 27, 2021

(65) Prior Publication Data
US 2023/0063050 A1    Mar. 2, 2023

(51) Int. Cl.
*H10D 1/00* (2025.01)
*H01G 4/30* (2006.01)
*H01G 4/35* (2006.01)
*H10D 1/68* (2025.01)

(52) U.S. Cl.
CPC .............. *H10D 1/042* (2025.01); *H01G 4/30* (2013.01); *H01G 4/35* (2013.01); *H10D 1/716* (2025.01)

(58) Field of Classification Search
CPC . H01L 28/91; H01G 4/30; H01G 4/35; H10D 1/042; H10D 1/716
See application file for complete search history.

(56) References Cited

U.S. PATENT DOCUMENTS

| 6,028,347 A * | 2/2000 | Sauber | H01L 23/585 |
| | | | 257/632 |
| 7,952,167 B2 * | 5/2011 | Lee | H01L 23/585 |
| | | | 257/E21.523 |
| 8,624,346 B2 * | 1/2014 | Su | H01L 25/50 |
| | | | 257/793 |

(Continued)

FOREIGN PATENT DOCUMENTS

| JP | 2019071335 A | 5/2019 |
| TW | 202109901 A | 3/2021 |

OTHER PUBLICATIONS

Taiwan Patent Office; Application No. 111126062; Office Action mailed Jul. 5, 2023, 9 pages.

*Primary Examiner* — Lex H Malsawma
(74) *Attorney, Agent, or Firm* — The Marbury Law Group, PLLC

(57) ABSTRACT

A semiconductor structure includes a substrate containing first-type deep trenches and second-type deep trenches. The first-type deep trenches and the second-type deep trenches have lengthwise sidewalls that laterally extend along different directions. The semiconductor structure includes a capacitor structure, which includes a layer stack containing at least three metallic electrode layers interlaced with at least two node dielectric layers. Each layer within the layer stack includes a horizontally-extending portion that overlies a top surface of the substrate and vertically-extending portions that protrude downward into a respective one of the first-type deep trenches and second-type deep trenches. The different orientations of the lengthwise directions of the deep trenches reduces deformation of the semiconductor structure. Stress-relief structures may be formed in corner regions of the capacitor structure to provide structural reinforcement.

20 Claims, 14 Drawing Sheets

(56) References Cited

U.S. PATENT DOCUMENTS

| | | | |
|---|---|---|---|
| 2006/0055005 A1* | 3/2006 | Furusawa | H01L 23/564 257/637 |
| 2006/0194124 A1 | 8/2006 | Watanabe et al. | |
| 2008/0073784 A1* | 3/2008 | Lee | H01L 23/562 257/738 |
| 2010/0181645 A1* | 7/2010 | Marenco | H01L 28/60 257/532 |
| 2012/0211865 A1 | 8/2012 | Tian et al. | |
| 2013/0161792 A1* | 6/2013 | Tran | H01L 29/92 438/386 |
| 2020/0161416 A1 | 5/2020 | Tsai et al. | |

* cited by examiner

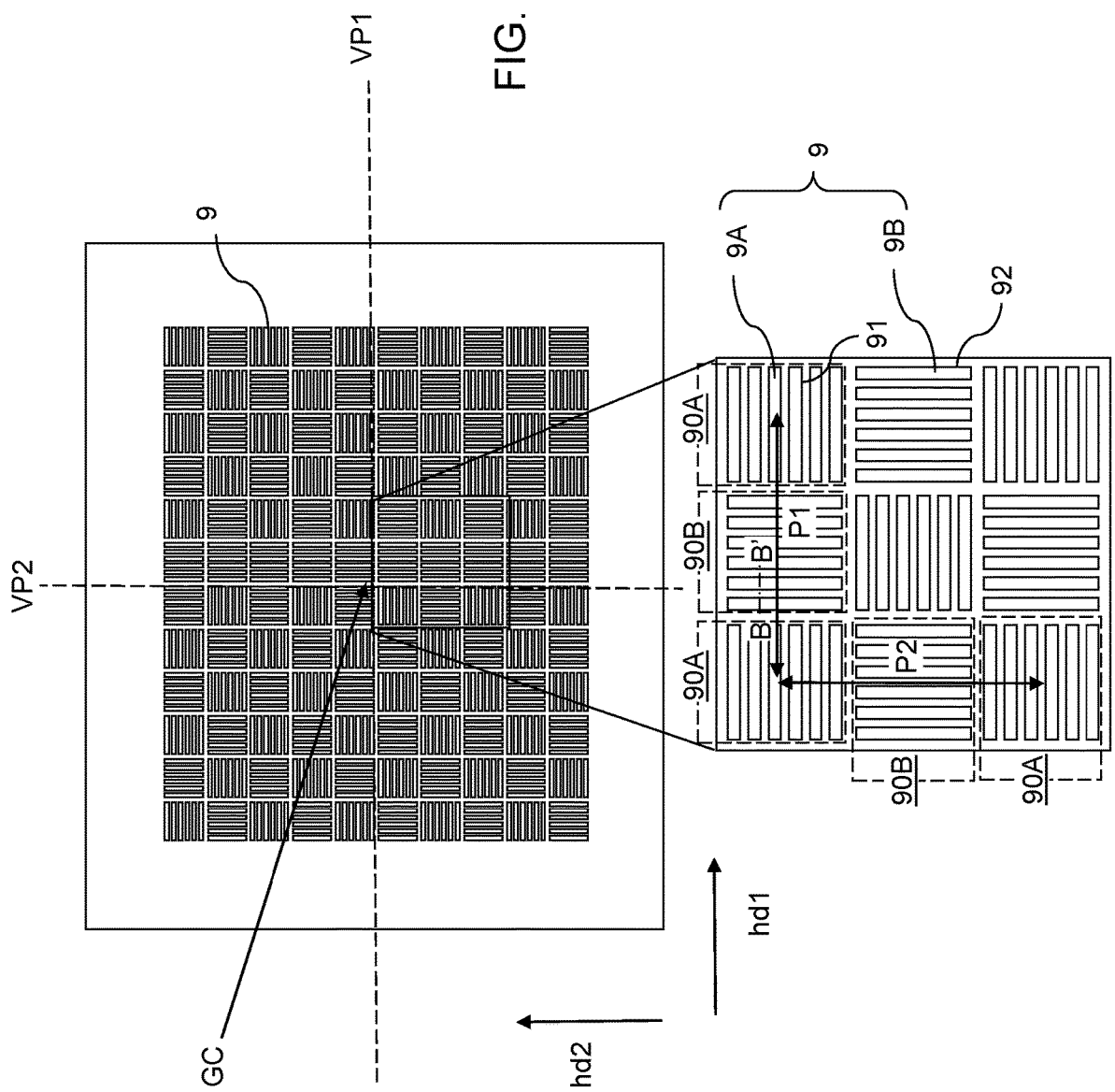

DEFORMATION-RESISTANT DEEP TRENCH CAPACITOR STRUCTURE AND METHODS OF FORMING THE SAME

BACKGROUND

Capacitors are used in semiconductor chips for many applications such as power supply stabilization. However, a significant amount of device area is often used to fabricate such capacitors. Accordingly, capacitors that may provide high capacitance with a small device footprint are desirable.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a vertical cross-sectional view of a first exemplary structure after formation of deep trenches in a first substrate according to an embodiment of the present disclosure. An inset illustrates a magnified view of a region of the first configuration of the exemplary structure.

DETAILED DESCRIPTION

Figure 1B:
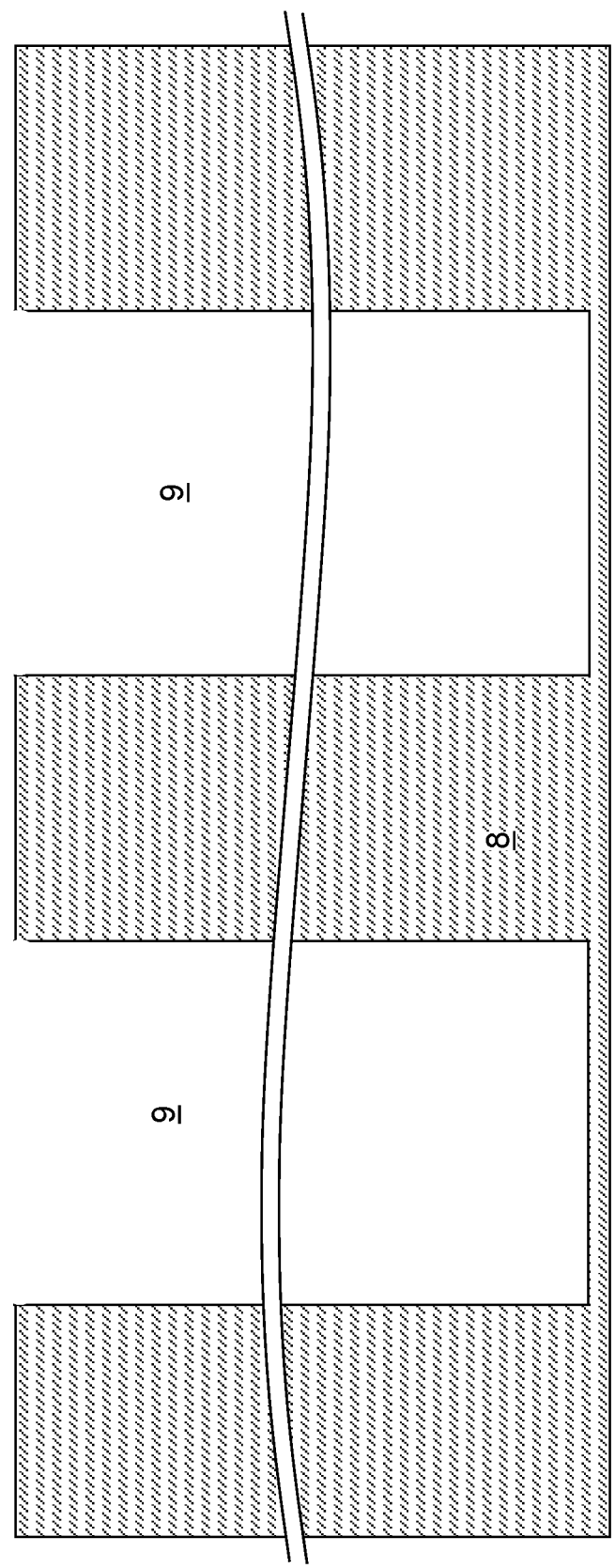
FIG. 1B is a vertical cross-sectional view of a region of the first exemplary structure along the vertical plane B-B' of FIG. 1A.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures.

The apparatus may be otherwise oriented (rotated 90 degrees or at other orientations) and the spatially relative descriptors used herein may likewise be interpreted accordingly.

The present disclosure is directed to semiconductor devices, and specifically to a deformation-resistant deep trench capacitor structure and methods of forming the same. Deep trench capacitors may be used as an integrated passive device to provide large capacitance. Such large capacitance capacitors may be used to stabilize a power supply and function as a noise filter in handheld devices. Deep trench capacitors may be formed in a first semiconductor die as a component of a power supply circuit. The first semiconductor die may be subsequently bonded to a second semiconductor die which may be a system-on-a-chip (SoC) semiconductor die. Generally, handling of the first semiconductor die after formation of a deep trench capacitor therein causes mechanical stress to the first semiconductor die, and may damage the deep trench capacitor.

According to an aspect of the present disclosure, orientations of lengthwise directions of deep trench capacitors may alternate along at least one horizontal direction to reduce deformation of a semiconductor die including the deep trench capacitors. Further, stress-relief structures may be provided around an array of deep trenches to reduce the effect of external stress applied to the deep trench capacitors and prevent warpage of the semiconductor die. The various aspects of the present disclosure are now described with reference to accompanying drawings.

FIG. 1A is a vertical cross-sectional view of a first exemplary structure after formation of deep trenches in a first substrate according to an embodiment of the present disclosure. An inset illustrates a magnified view of a region of the first configuration of the exemplary structure. FIG. 1B is a vertical cross-sectional view of a region of the first exemplary structure along the vertical plane B-B' of FIG. 1A. Referring to FIGS. 1A and 1B, a first exemplary structure according to an embodiment of the present disclosure is illustrated, which comprises a substrate 8 having a planar top surface. The substrate 8 may be a semiconductor substrate including a semiconductor material, and may have a thickness of at least 10 microns. In one embodiment, the substrate 8 may include a commercially available semiconductor wafer that may be diced into semiconductor dies after formation of deep trenches. For example, the substrate 8 may include a semiconductor substrate including single crystalline silicon and having a thickness in a range from 500 microns to 1,500 microns, although thicker or thinner substrates may be used.

Deep trenches 9 vertically extending into the substrate 8 may be formed by forming a patterned etch mask layer on the front side surface of the substrate 8. The pattern in the patterned etch mask layer may be transferred the into an upper portion of the substrate 8. An optional pad dielectric layer (not shown) such as a silicon oxide pad layer may be formed on the front side surface, i.e., the top surface, of the substrate 8 prior to formation of the patterned etch mask layer. In an exemplary embodiment, the pad dielectric layer may include a silicon oxide layer having a thickness in a range from 20 nm to 100 nm, although thicker or thinner pad dielectric layers may be used.

The patterned etch mask layer may include a silicon nitride layer or a borosilicate glass (BSG) layer having a thickness in a range from 200 nm to 600 nm, although different materials and/or lesser or greater thicknesses may also be used for the optional pad dielectric layer and the patterned etch mask layer. The patterned etch mask layer may be formed by depositing a blanket etch mask layer, forming a lithographically patterned photoresist layer over the blanket etch mask layer, and by transferring the pattern in the lithographically patterned photoresist layer through the blanket etch mask layer using an anisotropic etch process such as a reactive ion etch process.

An anisotropic etch process may be performed to transfer the pattern in the patterned etch mask layer through an upper portion of the substrate 8 to form the deep trenches 9. For example, a reactive ion etch process using a combination of gases including $HBr$, $NF_3$, $O_2$, and $SF_6$ may be used to form the deep trenches 9. The depth of the deep trenches 9 may be in a range from 2 microns to 20 microns, such as from 3 microns to 10 microns, although deeper or shallower trenches may be used. The horizontal cross-sectional shape of each deep trench 9 may have a shape of a circle, an ellipse, a rectangle, a rounded rectangle, an annulus having an inner periphery and an outer periphery of various shapes, or of any two-dimensional shape that defines an enclosed volume. Generally, at least one deep trench 9 extending downward from a top surface of the substrate may be formed in the substrate 8. The at least one deep trench 9 may comprise a plurality of deep trenches 9 having a depth that is greater than 2 microns.

In one embodiment, each of the deep trenches 9 may be laterally elongated with a uniform width. A predominant portion (such as more than 50% of the entire area) of each deep trench 9 may have a width that is sufficient to accommodate vertically-extending portions of all metallic electrode layers and at least two node dielectric layers to be subsequently formed. For example, a predominant portion of each deep trench 9 may have a width that is sufficient to accommodate vertically-extending portions of at least three metallic electrode layers and at least two node dielectric layers. In an illustrative example, a predominant portion of each deep trench 9 may have a width that is in a range from 50 nm to 1,000 nm, although lesser and greater widths may also be used.

In one embodiment, first-type deep trenches 9A and second-type deep trenches 9B may be formed into an upper portion of the substrate 8. The first-type deep trenches 9A may have first lengthwise sidewalls 91 that laterally extend along a first horizontal direction hd1 and the second-type deep trenches 9B may have second lengthwise sidewalls 92 that laterally extend along a second horizontal direction hd2 that is different from the first horizontal direction hd1. In one embodiment, the second horizontal direction hd2 may be perpendicular to the first horizontal direction hd1.

In one embodiment, each of the first-type deep trenches 9A and the second-type deep trenches 9B may have a length-to-width ratio in a range from 3 to 30. In one embodiment, each of the first-type deep trenches 9A and the second-type deep trenches 9B has a depth-to-width ratio in a range from 10 to 200. In one embodiment, each of the first-type deep trenches 9A and the second-type deep trenches 9B has a depth in a range from 2 micron to 20 microns.

In one embodiment, clusters 90A of subsets of the first-type deep trenches 9A and clusters 90B of subsets of the second-type deep trenches 9B laterally alternate along at least one direction that is selected from the first horizontal direction hd1 and the second horizontal direction hd2. The second horizontal direction hd2 may be perpendicular to the first horizontal direction hd1. In one embodiment, the clusters 90A of subsets of the first-type deep trenches 9A and clusters 90B of subsets of the second-type deep trenches 9B laterally alternate along the first horizontal direction hd1 and along the second horizontal direction hd2. In the illustrated example, each cluster of a subset of the first-type deep trenches 9A includes six first-type deep trenches 9A, and each cluster of a subset of the second-type deep trenches 9B includes six second-type deep trenches 9B.

In one embodiment, the first-type deep trenches 9A and the second-type deep trenches 9B comprise a two-dimensional array of deep trenches 9 in which the first-type deep trenches 9A are arranged as a first two-dimensional periodic array and the second-type deep trenches 9B are arranged as a second two-dimensional periodic array that is interlaced with the first two-dimensional periodic array. In one embodiment, each of the first two-dimensional periodic array and the second two-dimensional periodic array has a first periodic pitch P1 along the first horizontal direction hd1 and has a second periodic pitch hd2 along the second horizontal direction hd2. In one embodiment, the second two-dimensional periodic array may be laterally offset along the first horizontal direction hd1 by one half of the first periodic pitch P1, and may be laterally offset along the second horizontal direction hd2 by one half of the second periodic pitch P2.

The photoresist layer may be removed prior to the anisotropic etch process that forms the deep trenches 9, or may be consumed during the anisotropic etch process that forms the deep trenches 9. The patterned etch mask layer and the optional dielectric pad layer may be subsequently removed, for example, by a respective isotropic etch process such as a wet etch process.

Figure 2:
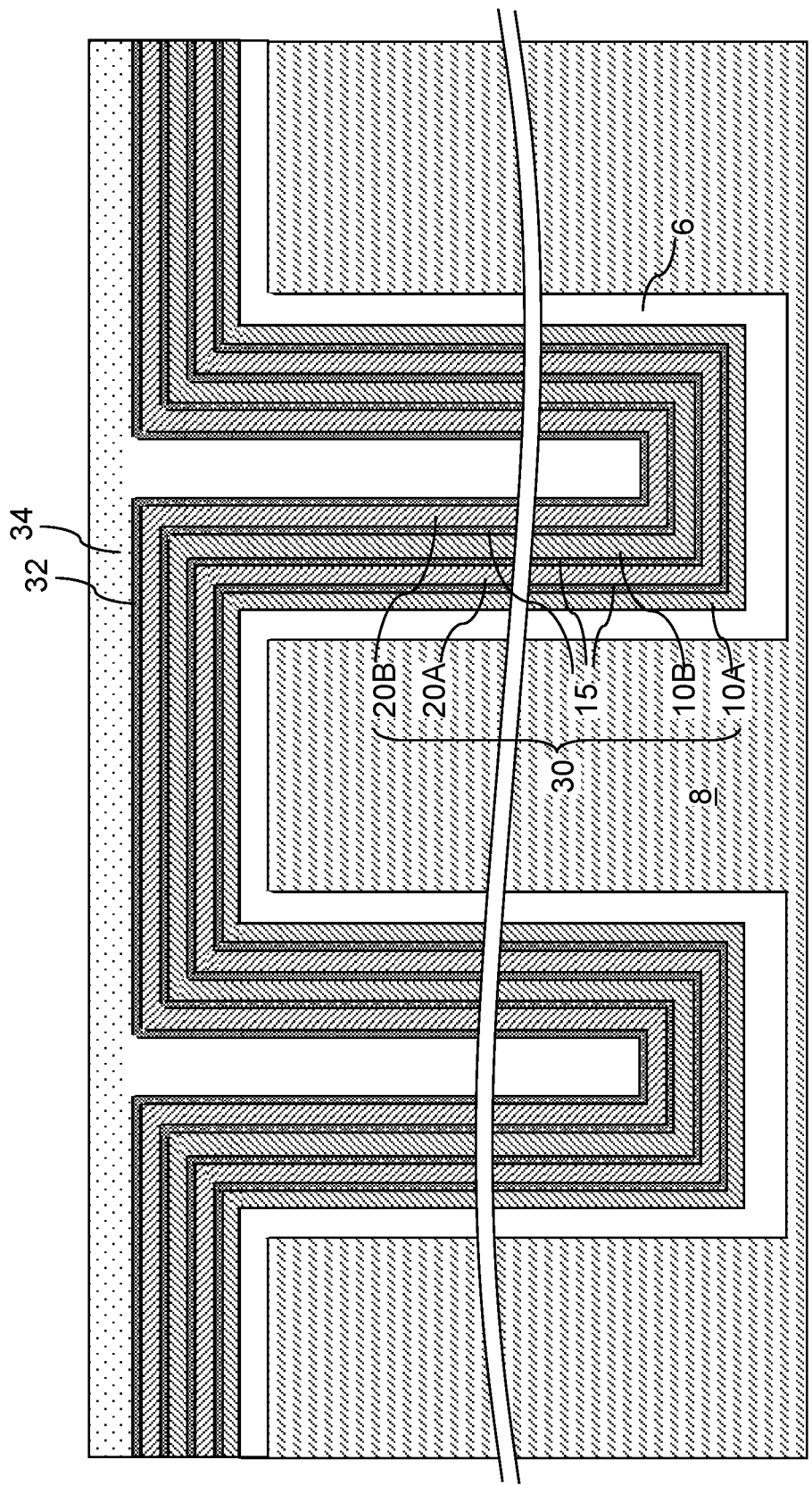
FIG. 2 is a vertical cross-sectional view of a region of the first exemplary structure after formation of a layer stack including at least three metallic electrode layers interlaced with at least two node dielectric layers according to an embodiment of the present disclosure.

FIG. 2 is a vertical cross-sectional view of a region of the first exemplary structure after formation of a layer stack including at least three metallic electrode layers interlaced with at least two node dielectric layers according to an embodiment of the present disclosure. Referring to FIG. 2, a dielectric liner 6 may be formed on the physically exposed surface of the semiconductor substrate 8 including the top surface of the semiconductor substrate 8 and sidewalls of the deep trenches 9. The dielectric liner 6 may include a dielectric material that provides electrical isolation between the deep trench capacitors to be subsequently formed and the substrate 8. For example, the dielectric liner 6 may include silicon oxide, silicon nitride, silicon oxynitride, and/or a dielectric metal oxide. Other suitable materials within the contemplated scope of disclosure may also be used. In an illustrative example, the dielectric liner 6 may include a silicon oxide layer formed by thermal oxidation of surface portions of the substrate 8 that includes silicon. The thickness of the dielectric liner 6 may be in a range from 4 nm to 100 nm, although lesser and greater thicknesses may also be used.

An alternating layer stack 30 of metallic electrode layers (10A, 20A, 10B, 20B) and node dielectric layers 15 may be formed by a respective conformal deposition process. The alternating layer stack 30 includes at least three metallic electrode layers (20A, 20B) interlaced with at least two node dielectric layers 15, and continuously extending over the top surface of the semiconductor substrate 8 and into each of the at least one deep trench 9. The alternating layer stack 30 may continuously extends into each deep trench 9. A cavity may be present in an unfilled volume each the deep trench 9. Generally, the at least three metallic electrode layers (10A, 20A, 10B, 20B) and the at least two node dielectric layers 15 are deposited by a respective conformal deposition process.

Each of the metallic electrode layers (10A, 20A, 10B, 20B) may include a metallic material, which may comprise, and/or consist essentially of, a conductive metallic nitride, an elemental metal, or an intermetallic alloy. In one embodiment, each metallic electrode layer (10A, 20A, 10B, 20B) comprises, and/or consists essentially of, a conductive metallic nitride material, which may be a metallic diffusion barrier material. For example, each metallic electrode layer (10A, 20A, 10B, 20B) may include, and/or may consist essentially of, a conductive metallic nitride material such as TiN, TaN, or WN. Other suitable materials within the contemplated scope of disclosure may also be used.

Use of a metallic diffusion barrier material for the metallic electrode layers (10A, 20A, 10B, 20B) may be advantageous because diffusion of metallic elements through the node dielectric layers 15 and/or through the dielectric liner 6 may cause deleterious effects for deep trench capacitors. Each metallic electrode layer (10A, 20A, 10B, 20B) may be formed by a conformal deposition process such as chemical vapor deposition (CVD) or atomic layer deposition (ALD). The thickness of each metallic electrode layer (10A, 20A, 10B, 20B) may be in a range from 5 nm to 50 nm, such as from 10 nm to 30 nm, although lesser and greater thicknesses may also be used. In one embodiment, each metallic electrode layer (10A, 20A, 10B, 20B) may have the same material composition and the same thickness. In another embodiment, each metallic electrode layer (10A, 20A, 10B, 20B) may have the same material composition but have varying thicknesses. In yet another embodiment, each metallic electrode layer (10A, 20A, 10B, 20B) may have different material composition and the same thickness. In yet another embodiment, each metallic electrode layer (10A, 20A, 10B, 20B) may have different material composition and different thicknesses.

Each of node dielectric layers 15 may include a node dielectric material, which may be a dielectric metal oxide material having a dielectric constant greater than 7.9 (which is the dielectric constant of silicon nitride), i.e., a "high-k" dielectric metal oxide material, or may include silicon nitride. For example, the node dielectric layer 15 may include a dielectric metal oxide material such as aluminum oxide, hafnium oxide, zirconium oxide, tantalum oxide, lanthanum oxide, an alloy or a silicate thereof, and/or a layer stack thereof. In one embodiment, the node dielectric layer 15 may include amorphous aluminum oxide layer that may be subsequently annealed into polycrystalline aluminum oxide material after formation of contact via structures. Other suitable materials within the contemplated scope of disclosure may also be used.

Each node dielectric layer 15 may be formed by a conformal deposition process such as chemical vapor deposition (CVD) or atomic layer deposition (ALD). The thickness of each node dielectric layer 15 may be in a range from 1 nm to 20 nm, such as from 3 nm to 12 nm, although lesser and greater thicknesses may also be used. In one embodiment, each node dielectric layer 15 may have the same material composition and the same thickness. In another embodiment, each node dielectric layer 15 may have the same material composition but have varying thicknesses. In yet another embodiment, each node dielectric layer 15 may have different material composition and the same thickness. In yet another embodiment, each node dielectric layer 15 may have different material composition and different thicknesses. For example, in an embodiment, a first node dielectric layer 15 may be thinner than a second node dielectric layer 15.

The total number of the metallic electrode layers (10A, 20A, 10B, 20B) may be in a range from 3 to 16, such as from 4 to 8. The total number of the node dielectric layers 15 may be one less than the total number of the metallic electrode layers (10A, 20A, 10B, 20B).

While the present disclosure is described using an embodiment in which the alternating layer stack 30 of the metallic electrode layers (10A, 20A, 10B, 20B) and the node dielectric layers 15 include four metallic electrode layers (10A, 20A, 10B, 20B) and three node dielectric layers 15, embodiments are expressly contemplated herein in which different numbers of metallic electrode layers (10A, 20A, 10B, 20B) and different numbers of node dielectric layers 15 may be used within the alternating layer stack 30. Generally, an alternating layer stack 30 may include at least three metallic electrode layers (10A, 20A, 10B, 20B) interlaced with at least two node dielectric layers 15 that may be formed in, and over, at least one deep trench 9 formed in a substrate 8.

The metallic electrode layers (10A, 20A, 10B, 20B) may be sequentially numbered in the order of deposition. For example, the metallic electrode layers (10A, 20A, 10B, 20B) may include a first metallic electrode layer 10A, a second metallic electrode layer 20A, a third metallic electrode layer 10B, a fourth metallic electrode layer 20B, etc. Patterned portions of each odd-numbered metallic electrode layer (10A, 10B) may be subsequently used to form a primary electrode assembly that functions as a primary node, i.e., a first node, of a deep trench capacitor, and patterned portions of each even-numbered metallic electrode layer (20A, 20B) may be subsequently used to form a complementary electrode assembly that functions as a complementary node, i.e., a second node, of the deep trench capacitor. The total number of the metallic electrode layers (10A, 20A, 10B, 20B), the thicknesses of the metallic electrode layers (10A, 20A, 10B, 20B), and the width of the deep trenches 9 may be selected such that a predominant portion (i.e., more than 50%) of the entire volume of each deep trench 9 may be filled with the alternating layer stack 30 without completely filling the deep trench 9.

A capping dielectric material layer 32 and a dielectric fill material layer 34 may be optionally deposited over the alternating layer stack 30. The capping dielectric material layer 32 may include a same dielectric material as the node dielectric layers 15, and may have a thickness in a range from 1 nm to 20 nm, such as from 3 nm to 12 nm, although lesser and greater thicknesses may also be used.

The dielectric fill material layer 34 may be deposited on the capping dielectric material layer 32 or on the alternating layer stack 30 to fill the volumes of cavities that remain in the deep trenches 9. In one embodiment, the dielectric fill material layer 34 comprises, and/or consists essentially of, undoped silicate glass or a doped silicate glass.

Figure 3:
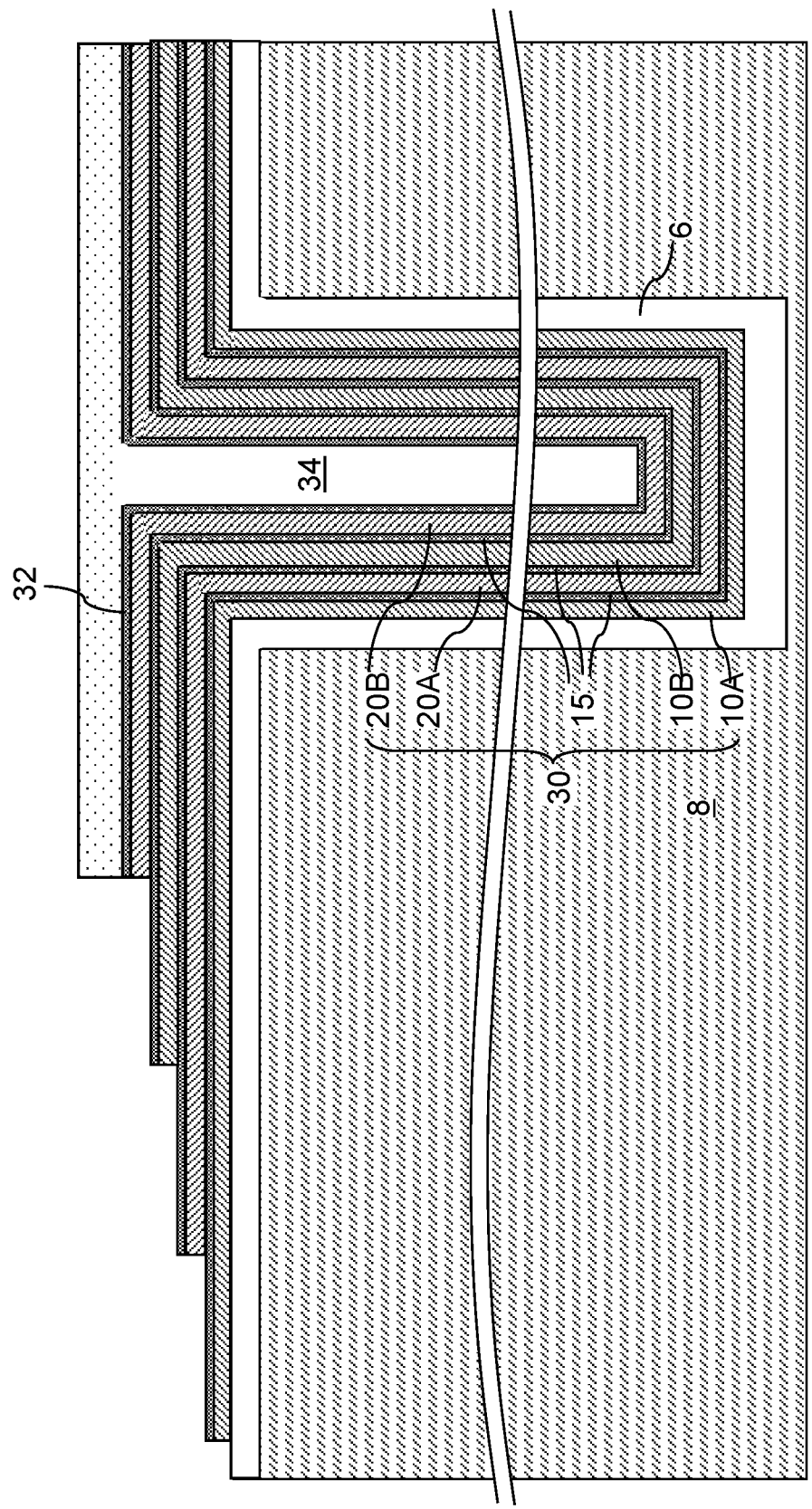
FIG. 3 is a vertical cross-sectional view of a peripheral region of the first exemplary structure after patterning the layer stack according to an embodiment of the present disclosure.

FIG. 3 is a vertical cross-sectional view of a peripheral region of the first exemplary structure after patterning the layer stack according to an embodiment of the present disclosure. Referring to FIG. 3, a trimmable mask layer may be applied over the dielectric fill material layer 34, and may be lithographically patterned to cover the area of the deep trenches 9. The entire periphery of the trimmable mask layer may be located outside the area of the deep trenches 9. A first set of etch processes may be performed to etch unmasked portions of the dielectric fill material layer 34, the optional capping dielectric material layer 32, and the topmost layer selected from the metallic electrode layers (10A, 10B, 20A, 20B). The first set of etch processes may include a set of wet etch processes.

Subsequently, the trimmable mask layer may be trimmed to laterally recess the periphery of the trimmable mask layer and to increase the area unmasked by the trimmable mask layer. A second set of etch processes may be performed to etch unmasked portions of the dielectric fill material layer 34, the optional capping dielectric material layer 32, unmasked portions of the topmost one of the node dielectric layers 15, and unmasked underlying portions of the metallic electrode layers (10A, 10B, 20A, 20B).

The trimming of the trimmable mask layer and additional sets of etch processes may be repeated to provide stepped surfaces for the metallic electrode layers (10A, 10B, 20A, 20B). The trimmable mask layer may be subsequently removed, for example, by ashing or by dissolution in a solvent.

Figure 4:
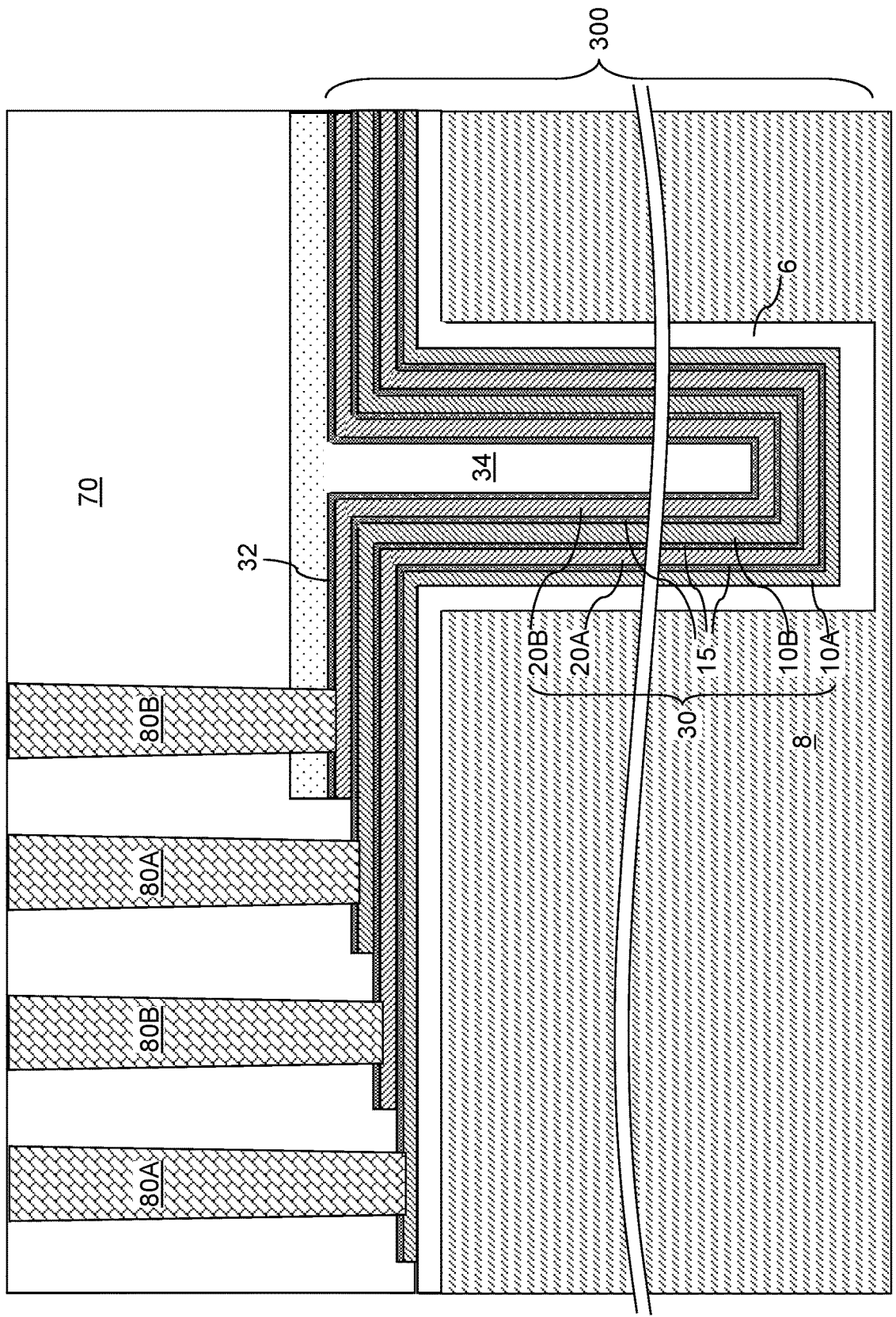
FIG. 4 is a vertical cross-sectional view of a region of the first exemplary structure after formation of a planarization dielectric layer and contact via structures according to an embodiment of the present disclosure.

FIG. 4 is a vertical cross-sectional view of a region of the first exemplary structure after formation of a planarization dielectric layer and contact via structures according to an embodiment of the present disclosure. Referring to FIG. 4, a planarizable dielectric material or a self-planarizing dielectric material may be deposited over the alternating layer stack (10A, 10B, 20A, 20B) and the dielectric fill material layer 34 to form a contact-level dielectric layer 70. The contact-level dielectric layer 70 may have a thickness in a range from 100 nm to 2,000 nm, although lesser and greater thicknesses may also be used.

Contact via structures (80A, 80B) may be formed through the contact-level dielectric layer 70 on a respective one of the metallic electrode layers (10A, 10B, 20A, 20B). Each of the at least three metallic electrode layers (10A, 10B, 20A, 20B) may be contacted by a respective contact via structure (80A, 80B) embedded within the contact-level dielectric layer 70, which overlies the horizontally-extending portion of the dielectric fill material layer 34.

Additional dielectric material layers (not shown) and additional metal interconnect structures (not shown) may be formed over the contact-level dielectric layer 70 and the contact via structures (80A, 80B) as known in the art. Bonding structures such as copper bonding pads and/or copper bonding pillar structures may be formed over the metal interconnect structures as known in the art. Subsequently, the first exemplary structure may be diced into a plurality of semiconductor dies, which may be a capacitor die that may be attached to another semiconductor die. Each semiconductor die may include a deep trench capacitor 300.

The capacitor structure in the first exemplary structure includes at least one laterally alternating sequence of clusters 90A of first-type deep trenches 9A and clusters 90B of second-type deep trenches 9B. The first-type deep trenches 9A have lengthwise sidewalls that laterally extend along the first horizontal direction hd1 and the second-type deep trenches 9B have lengthwise sidewalls that laterally extend along the second horizontal direction hd2. The alternation of lengthwise directions of the deep trenches 9 may homogenize along the different azimuthal directions (i.e., along horizontal directions) the mechanical stress generated by the vertically-extending portions of the alternating layer stack 30, and thus, reduces stress-induced deformation of a semiconductor die that includes the deep trench capacitor of the first exemplary structure. In one embodiment, each layer within the alternating layer stack 30 comprises a horizontally-extending portion that overlies a top surface of the substrate 8 and vertically-extending portions that protrude downward into a respective one of the first-type deep trenches 9A and second-type deep trenches 9B.

Figure 5:
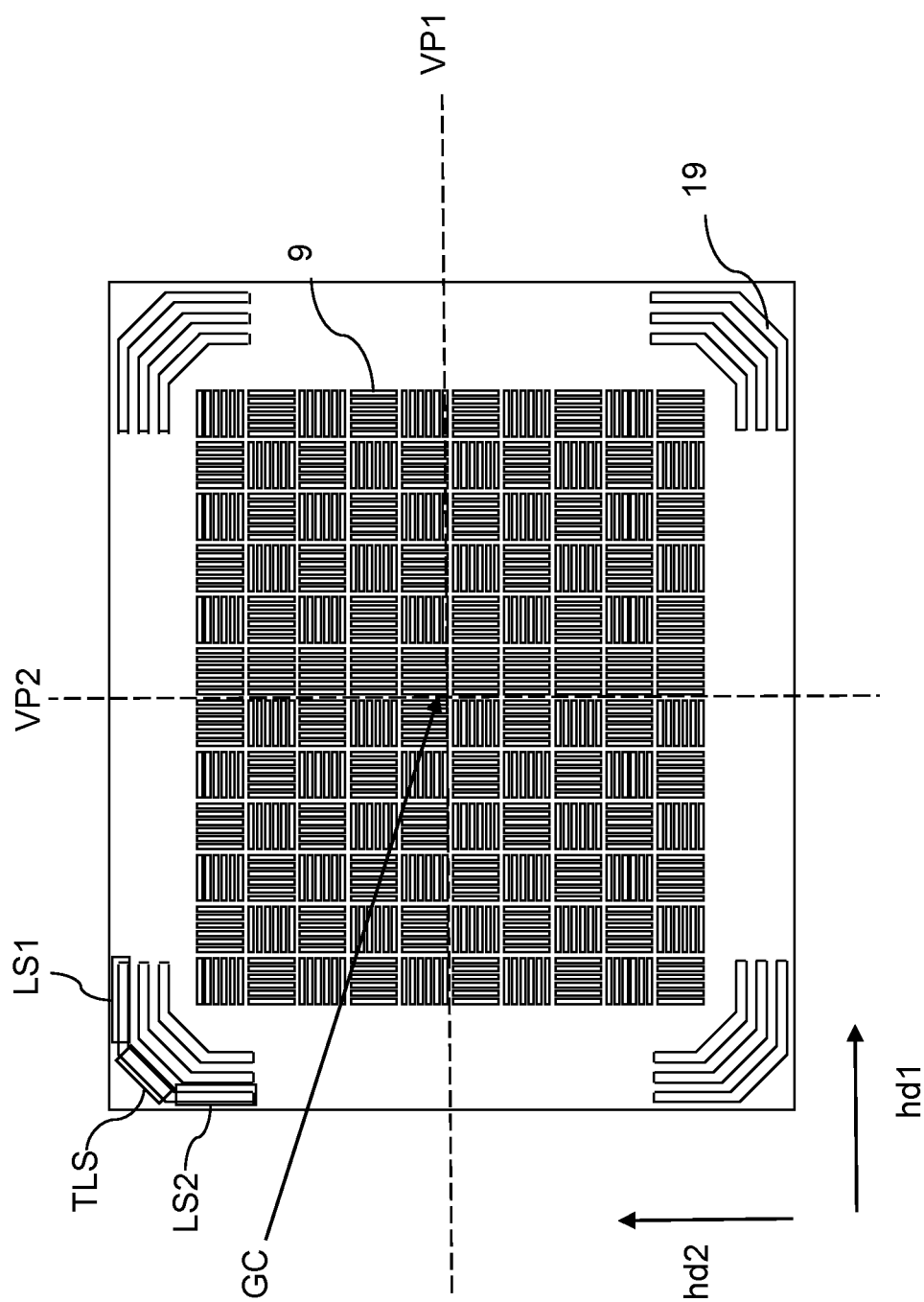
FIG. 5 is a top-down view of a second exemplary structure after formation of deep trenches according to an embodiment of the present disclosure.

FIG. 5 is a top-down view of a second exemplary structure after formation of deep trenches according to an embodiment of the present disclosure. Referring to FIG. 5, a second exemplary structure according to an embodiment of the present disclosure may be derived from the first exemplary structure illustrated in FIGS. 1A and 1B by forming additional deep trenches concurrently with formation of the deep trenches 9. The additional deep trenches may be formed in regions that are not used to form a deep trench capacitor, and are herein referred to as dummy deep trenches 19. In one embodiment, the dummy deep trenches 19 may be formed at corner regions of the two-dimensional array of deep trenches 9. Each of the dummy deep trenches 19 may vertically extend within the substrate 8.

In an illustrative example, the dummy deep trenches 19 may comprise four sets of at least one dummy deep trench 19 arranged with a mirror symmetry about a vertical plane passing through a geometrical center GC of the two-dimensional array of deep trenches 9. As used herein, a geometrical center of an element refers to a point that has a Cartesian coordinate that is the average of all Cartesian coordinates of the entire volume of the element. For example, the vertical plane may be a first vertical plane VP1 that passes through the geometrical center GC and is parallel to the first horizontal direction hd1, or may be a second vertical plane VP2 that passes through the geometrical center GC and is parallel to the second horizontal direction hd2.

In one embodiment, the second horizontal direction hd2 may be perpendicular to the first horizontal direction hd1, and each of the at least one dummy deep trench 19 comprises a tilted linear segment TLS that laterally extends along a respective horizontal direction that is at an angle greater than 0 degree and is less than 90 degrees with respective to the first horizontal direction hd1. In one embodiment, the tilt angle may be in a range from 30 degrees to 60 degrees such as 45 degrees. In one embodiment, each of the at least one dummy deep trench 19 comprises a first linear segment LS1 that is adjoined to the tilted linear segment TLS and laterally extending along the first horizontal direction hd1, and a second linear segment LS2 that is adjoined to the tilted linear segment TLS and laterally extending along the second horizontal direction hd2.

Figure 6A:
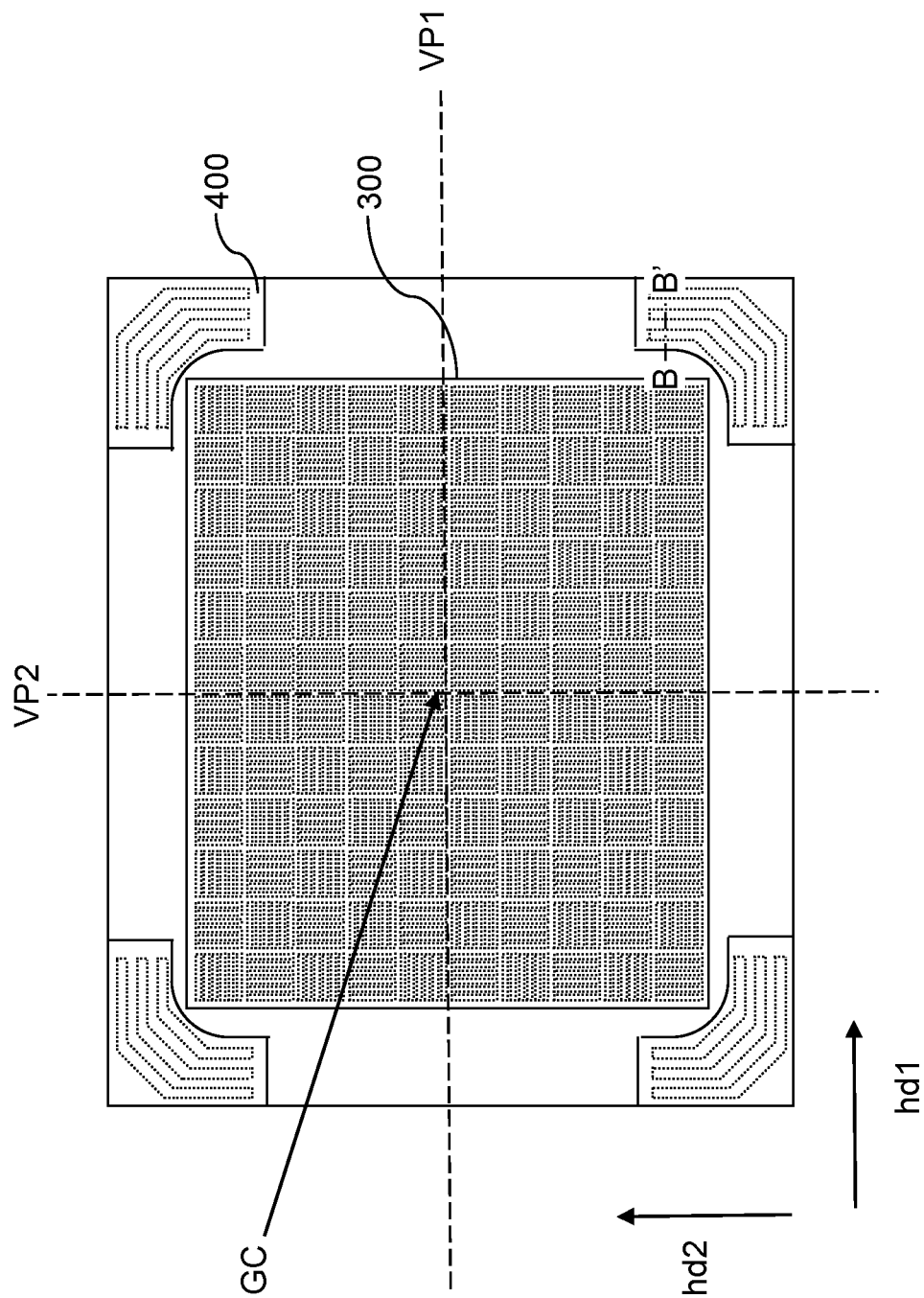
FIG. 6A is a top-down view of the second exemplary structure after patterning the layer stack and formation of a contact-level dielectric layer according to an embodiment of the present disclosure.
Figure 6B:
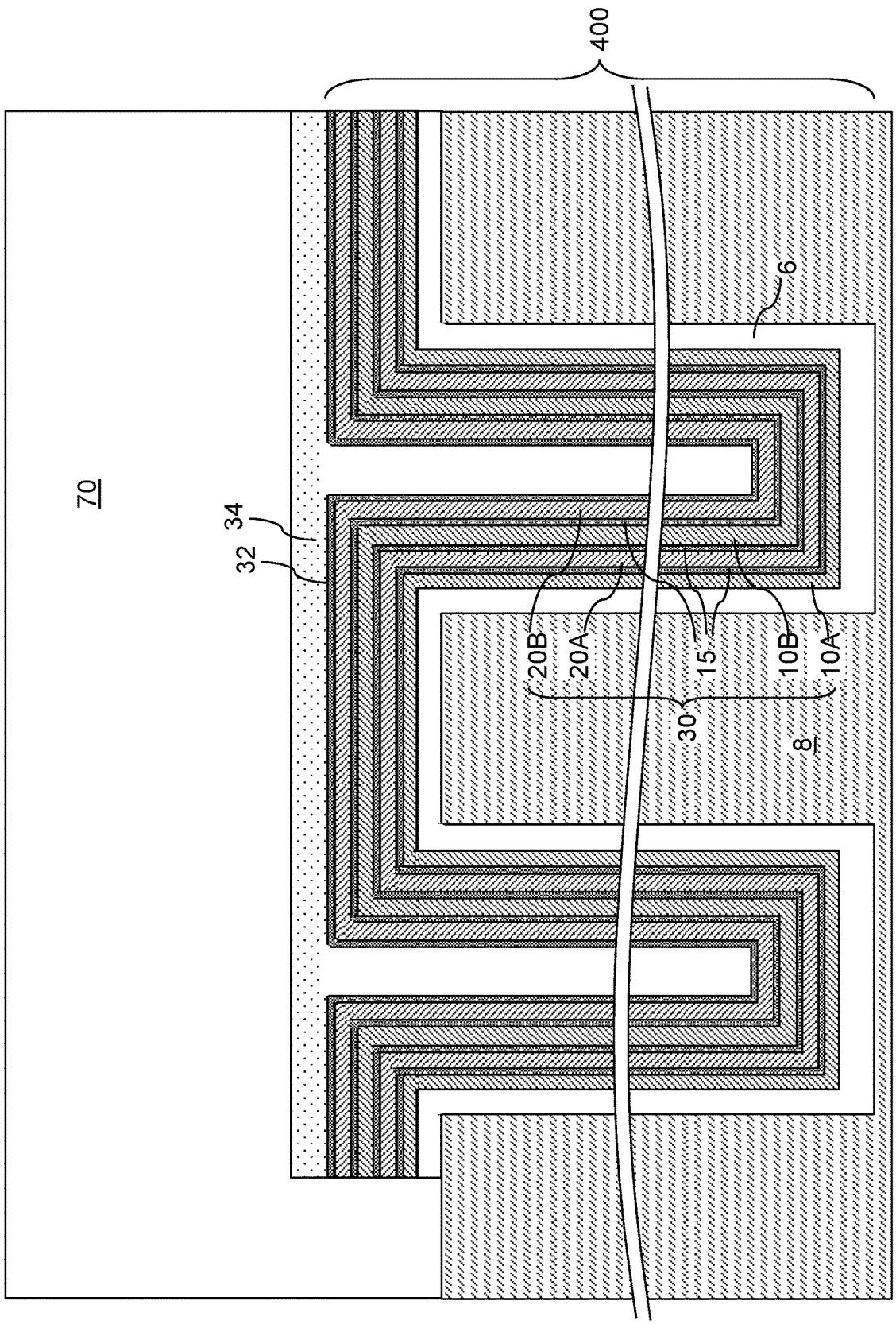
FIG. 6B is a vertical cross-sectional view of a region of the second exemplary structure along the vertical plane B-B' of FIG. 6A.

FIG. 6A is a top-down view of the second exemplary structure after patterning the alternating layer stack 30 and formation of a contact-level dielectric layer 70 according to an embodiment of the present disclosure. FIG. 6B is a vertical cross-sectional view of a region of the second exemplary structure along the vertical plane B-B' of FIG. 6A. Referring to FIGS. 6A and 6B, the processing steps of FIGS. 2-4 may be performed to form a deep trench capacitor 300 with a modification to the pattern of the trimmable mask layer such that the areas of the dummy deep trenches 19 are covered by the trimmable mask layer. A portion of the alternating layer stack 30 remains over each area of a set of at least one dummy deep trench 19. In this embodiment, each patterned portion of the alternating layer stack 30 may have stepped surfaces. Alternatively, a patterned dielectric etch mask layer (not shown) may be used to mask each portion of the alternating layer stack 30. In this embodiment, sidewalls of the various layers within patterned portions of the alternating layer stack 30 may be vertically coincident, i.e., may be located within a same vertical plane. Each patterned portion of the alternating layer stack 30, the optional capping dielectric material layer 32, and the optional dielectric fill material layer 34 that fills or overlies a set of at least one dummy deep trench 19 within a corner region of the deep trench capacitor 300 comprises stress-relief structure 400, which protects the deep trench capacitor 300 from mechanical deformation when external mechanical stress is applied to the deep trench capacitor 300.

In one embodiment, the alternating layer stack 30 of the deep trench capacitor 300 and the stress-relief structures 400 may be formed by depositing a continuous layer stack including at least three continuous metallic electrode layers (10A, 10B, 20A, 20B) interlaced with at least two continuous node dielectric layers 15 in the first-type deep trenches 9A, the second-type deep trenches 9B, and each of the dummy deep trenches 19, and by subsequently patterning the continuous layer stack into the alternating layer stack 30 of the deep trench capacitor 300 and into the additional alternating layer stacks 30 within the stress-relief structures 400.

In one embodiment, stress-relief structures 400 may be formed at corner regions of the two-dimensional array of deep trenches 19 of the deep trench capacitor 300. In one embodiment, each of the stress-relief structures 400 comprises a respective set of at least one additional deep trench (such as at least one dummy deep trench 19) vertically extending within the substrate 8, and a respective additional layer stack 30 including at least three metallic material layers (10A, 10B, 20A, 20B) interlaced with at least two node dielectric layers 15. In one embodiment, each of the metallic material layers (10A, 10B, 20A, 20B) within the stress-relief structures 400 may be electrically isolated from the at least three metallic electrode layers (10A, 10B, 20A, 20B) within the capacitor structure 300.

In one embodiment, the stress-relief structures 400 comprises four stress-relief structures 400 arranged with a mirror symmetry about a vertical plane (VP1 or VP2) passing through a geometrical center GC of the two-dimensional array of deep trenches 9. In one embodiment, the second horizontal direction hd2 is perpendicular to the first horizontal direction hd1, and each of the at least one additional deep trench (i.e., the at least one dummy deep trench 19) comprises a tilted linear segment TLS that laterally extends along a respective horizontal direction that is at an angle greater than 0 degree and is less than 90 degrees with respective to the first horizontal direction hd1. In one embodiment, each of the at least one additional deep trench comprises: a first linear segment LS1 that is adjoined to the tilted linear segment TLS and laterally extending along the first horizontal direction hd1, and a second linear segment LS2 that is adjoined to the tilted linear segment TLS and laterally extending along the second horizontal direction hd2.

Figure 7:
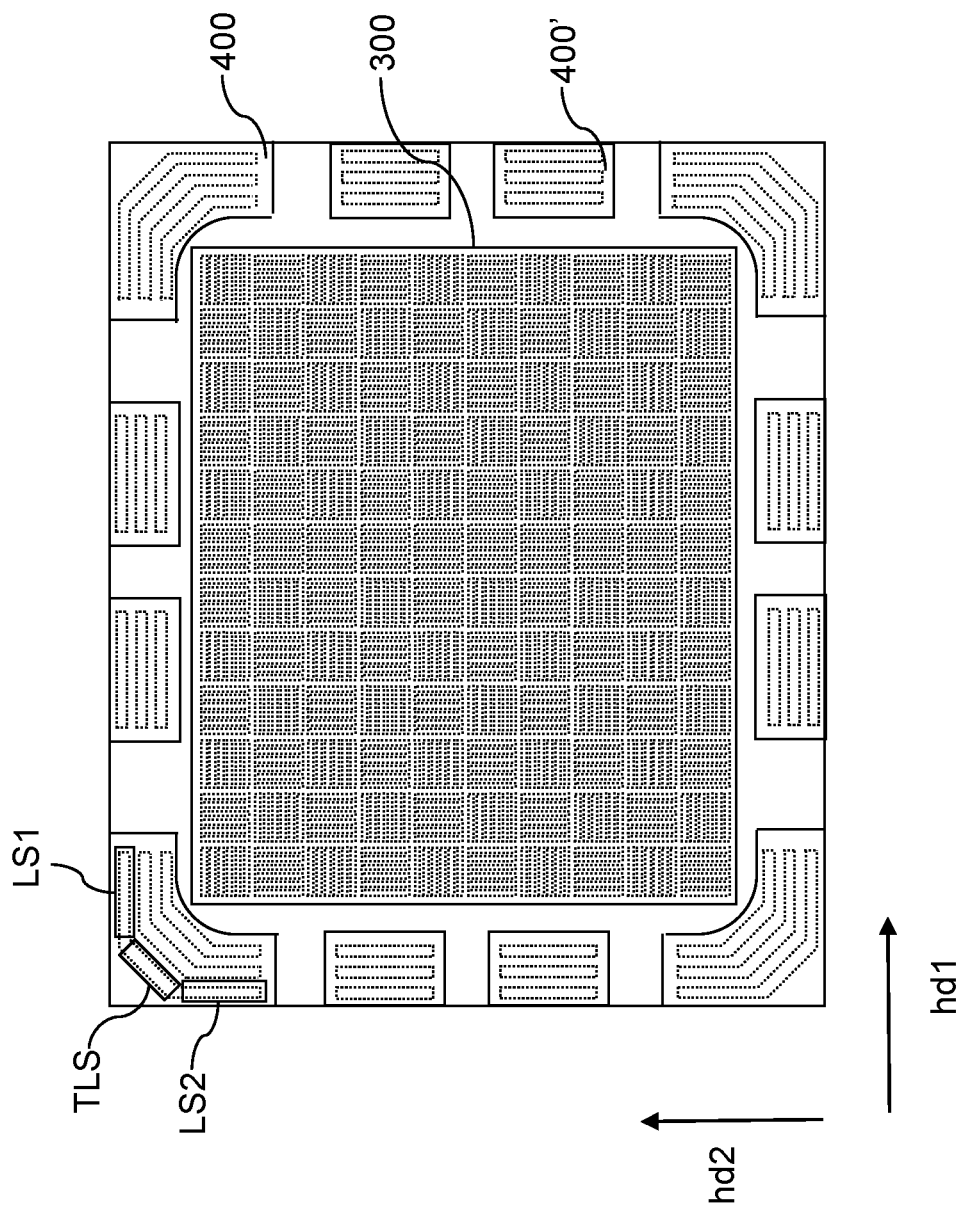
FIG. 7 is a top-down view of a third exemplary structure according to an embodiment of the present disclosure.

Referring to FIG. 7, a third exemplary structure according to an embodiment of the present disclosure may be derived from the second exemplary structure by forming additional stress-relief structures 400' around the periphery of the deep trench capacitor 300 between the four stress-relief structures 400 of the second exemplary structure of FIGS. 6A and 6B. In this embodiment, the additional stress-relief structures 400' may include linear segments that are parallel to the first horizontal direction hd1 or to the second horizontal direction hd2, and are located within a respective set of at least one dummy deep trench 19.

Figure 8:
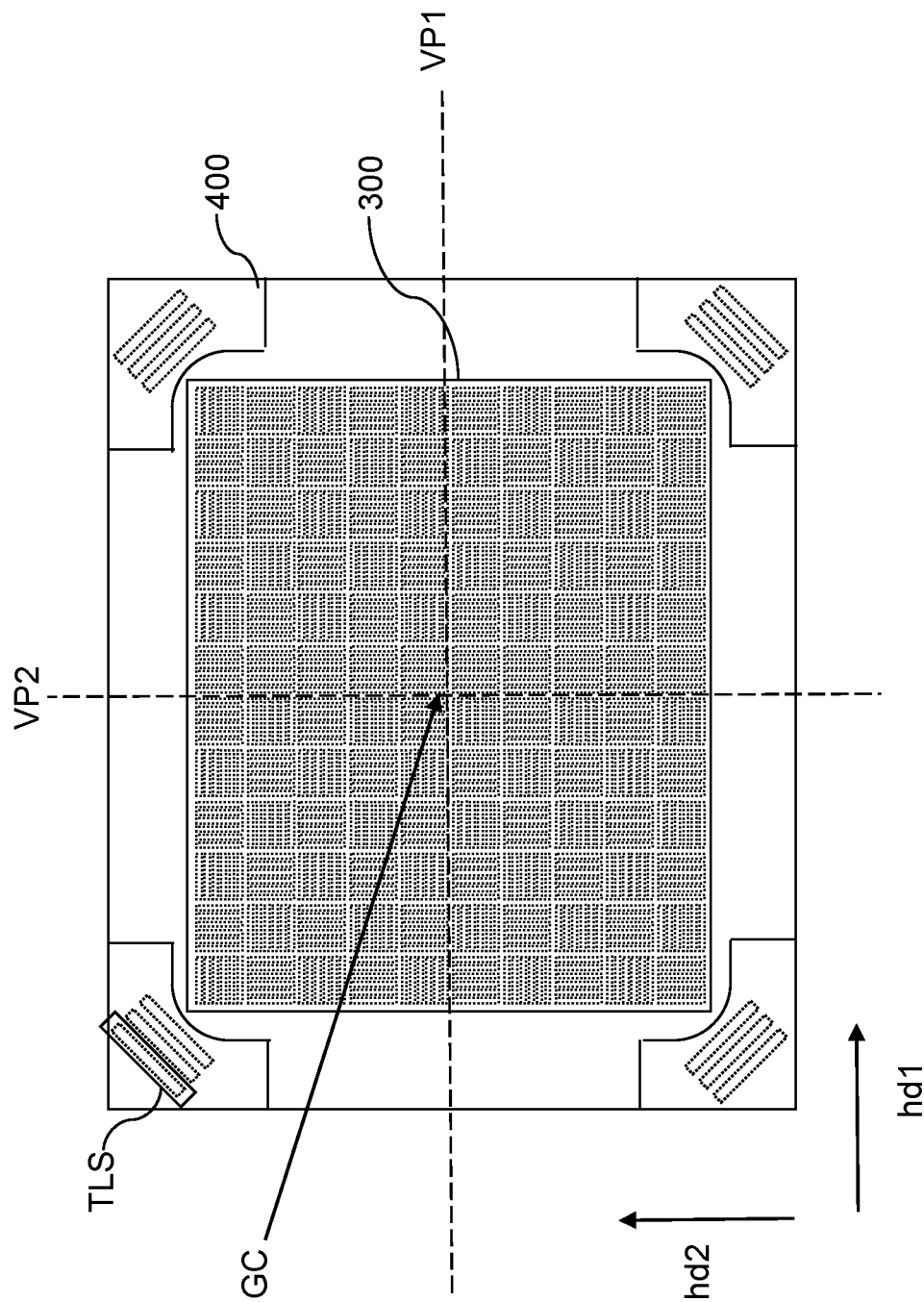
FIG. 8 is a top-down view of a fourth exemplary structure according to an embodiment of the present disclosure.

Referring to FIG. 8, a fourth exemplary structure according to an embodiment of the present disclosure may be derived from the second exemplary structure of FIG. 6 by forming the dummy deep trenches 19 so that each dummy deep trench 19 includes a tilted linear segment TLS, and does not include any linear segment (LS1, LS2) that laterally extends along the first horizontal direction hd1 or along the second horizontal direction hd2 as in the previously disclosed embodiments illustrated in FIGS. 5-7.

Figure 9:
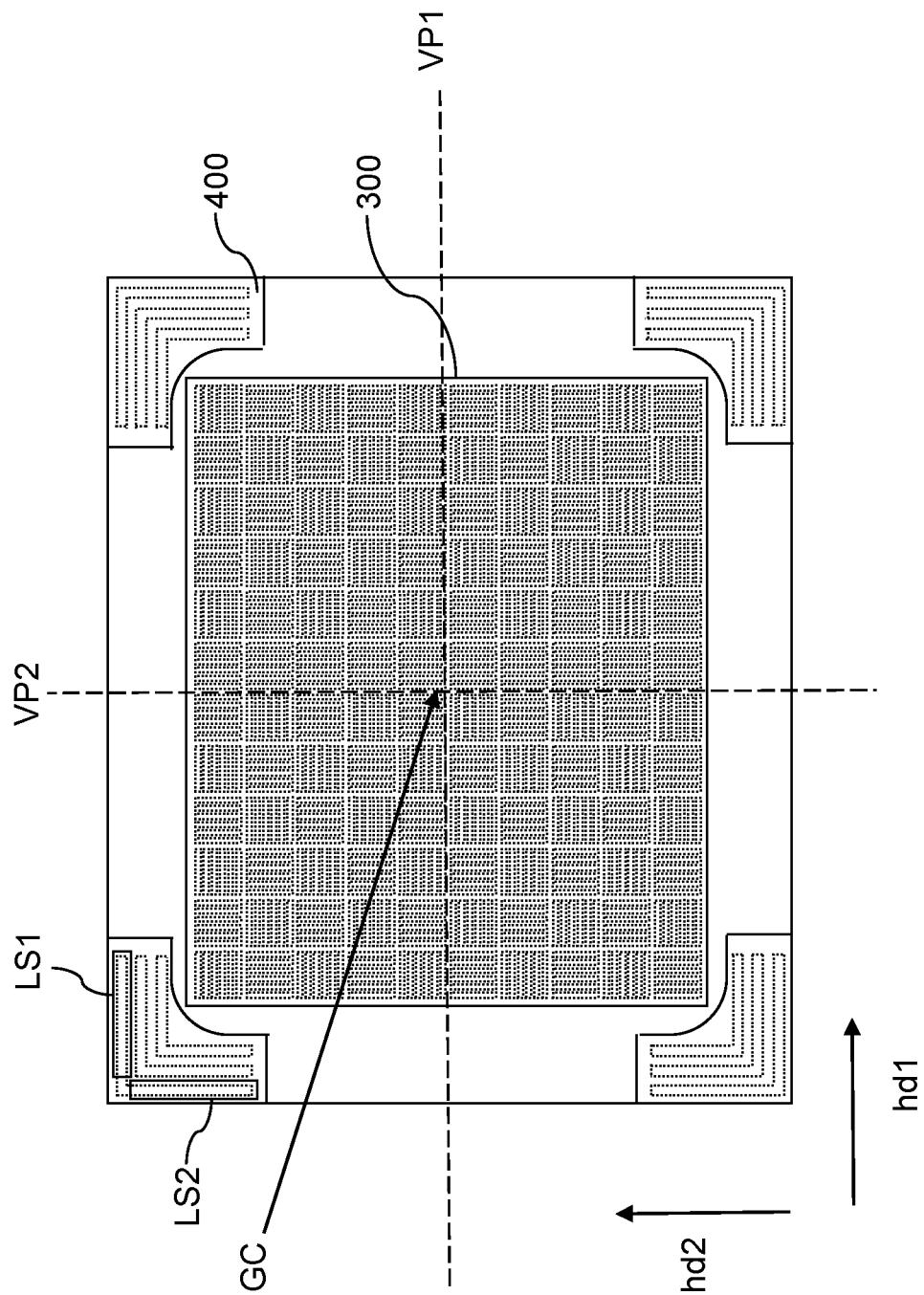
FIG. 9 is a top-down view of a fifth exemplary structure according to an embodiment of the present disclosure.

Referring to FIG. 9, a fifth exemplary structure according to an embodiment of the present disclosure may be derived from the second exemplary structure of FIG. 6 by eliminating the tilted linear segments TLS such that each dummy deep trench 19 includes a first linear segment LS1 and a second linear segment LS2 that is adjoined directly to the first linear segment LS1. Each first linear segment LS1 may be parallel to the first horizontal direction hd1, and each second linear segment LS2 may be parallel to the second horizontal direction hd2.

Figure 10:
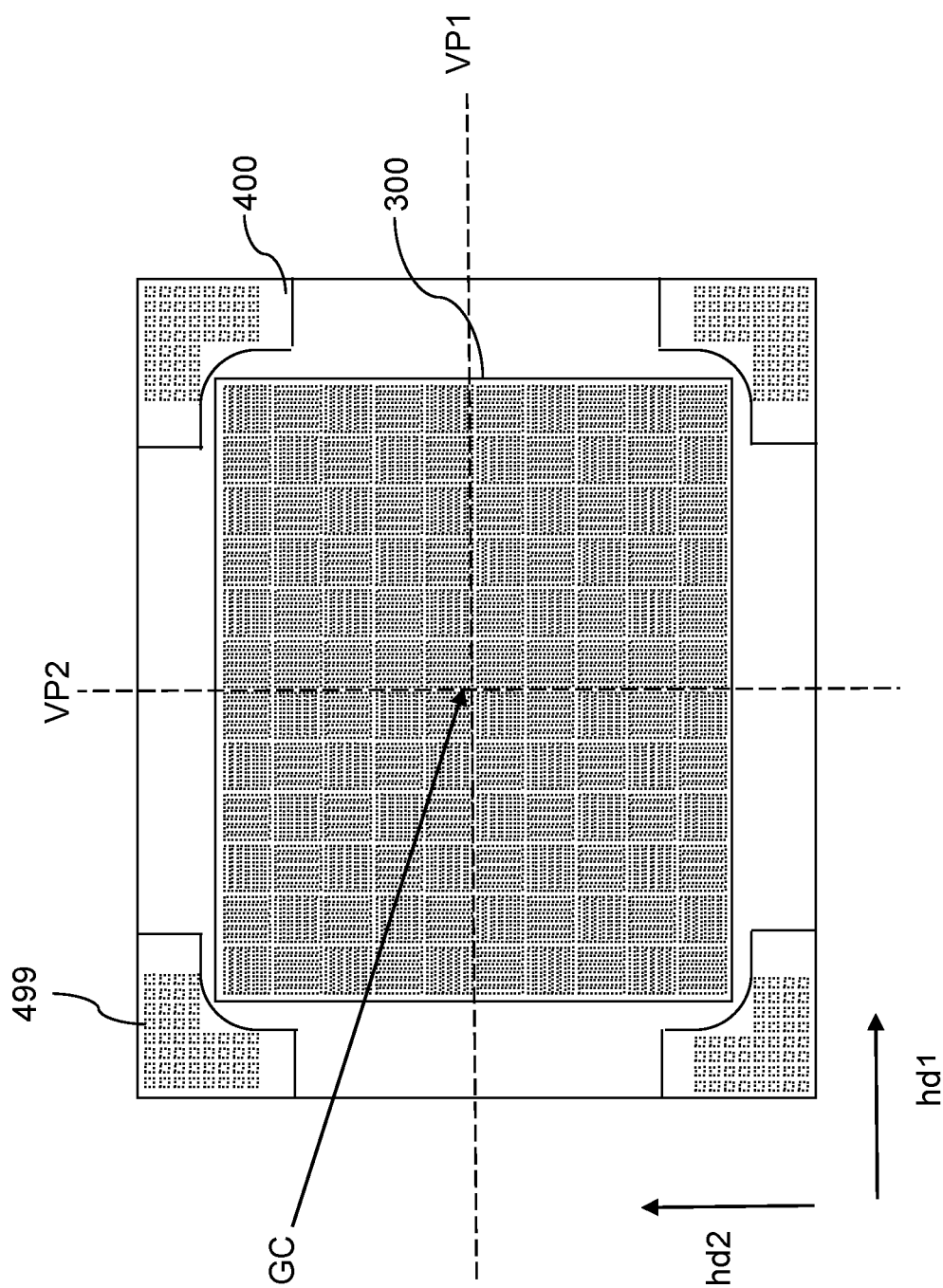
FIG. 10 is a top-down view of a sixth exemplary structure according to an embodiment of the present disclosure.

Referring to FIG. 10, a sixth exemplary structure according to an embodiment of the present disclosure may be derived from the second exemplary structure illustrated in FIGS. 6A and 6B by forming a two-dimensional array of discrete dummy deep trenches 499 within each corner region of the deep trench capacitor 300 in lieu of elongated and/or segmented dummy deep trenches 19. In this embodiment, each set of at least one additional deep trench comprises a two-dimensional array of additional deep trenches (i.e., a two-dimensional array of dummy deep trenches 19) having a first periodicity along the first horizontal direction hd1 and having a second periodicity along the second horizontal direction hd2. In a non-limiting illustrative example, each dummy deep trench 19 may have a horizontal cross-sectional shape of a circle, a square, a rounded square, or a rounded rectangle having a length-to-width ratio not greater than 2.

Figure 11:
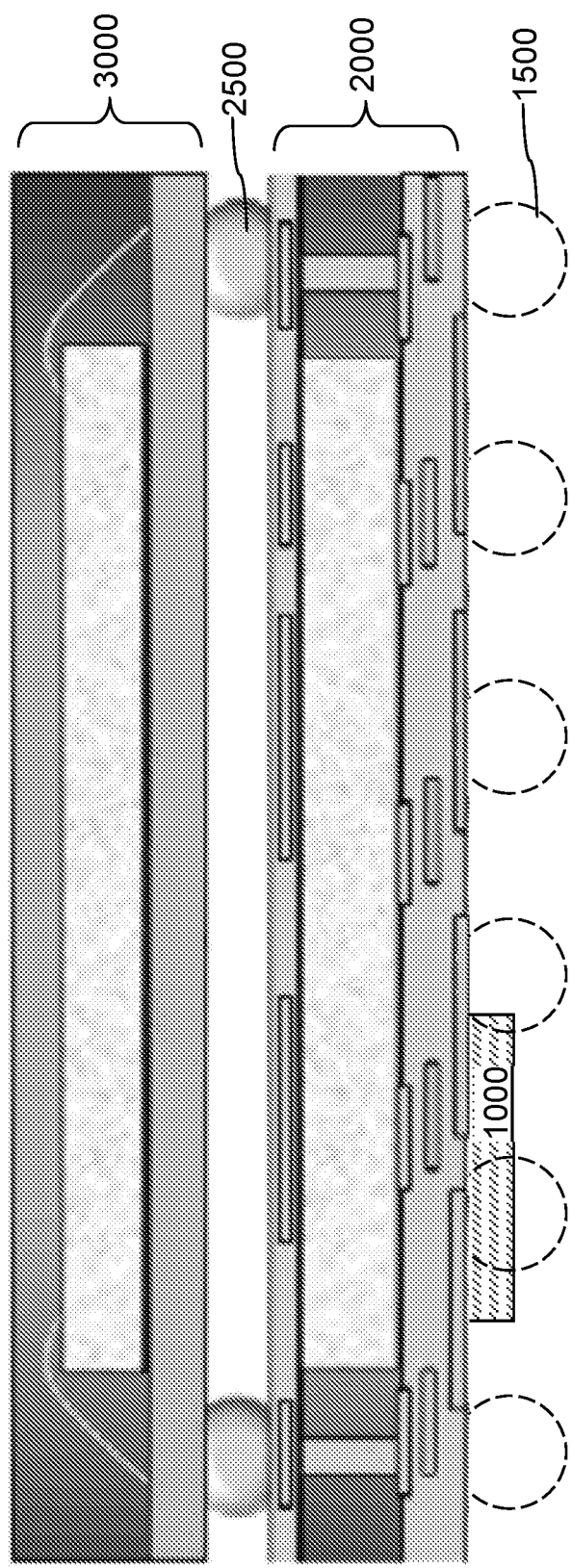
FIG. 11 is a vertical cross-sectional view of an exemplary chip assembly incorporating a semiconductor die containing a deep trench capacitor according to an embodiment of the present disclosure.

Referring to FIG. 11, a non-limiting exemplary application of the semiconductor die derived from the various exemplary structures is illustrated. In one embodiment, first semiconductor die 1000 may be formed by dicing the substrate 8 of any of the exemplary structures of FIGS. 4, 5, 6A and 6B, 7, 8, 9, or 10. The first semiconductor die 1000 comprises a diced portion of the substrate 8, the capacitor structure 300, and the stress-relief structures 400, if present.

Generally, a first semiconductor die 1000 may be provided which incorporate any of the exemplary structures of FIGS. 4, 5, 6A and 6B, 7, 8, 9, or 10. The first semiconductor die 1000 may be attached to the bottom side of a second semiconductor die 2000. For example, the first semiconductor die 1000 may be bonded to a second semiconductor die 2000 that comprises semiconductor devices therein. The capacitor structure 300 is electrically connected to the semiconductor devices through bonding pads or solder material portions.

For example, the second semiconductor die 2000 may be a system-on-a-chip (SoC) die 2000, which may be bonded to an integrated fan-out package on package (InFO PoP) die 3000 via an array of solder balls 2500. The second semiconductor die 2000 may be bonded to another module, such as a printed circuit board (PCB) via another array of solder balls 1500. The deep trench capacitor(s) in the semiconductor die 1000 may be used to stabilize the power supply system in the second semiconductor die 2000.

Referring to all drawings and according to various embodiments of the present disclosure, a semiconductor structure is provided, which comprises: a substrate 8 comprising first-type deep trenches 9A and second-type deep trenches 9B therein, wherein the first-type deep trenches 9A have first lengthwise sidewalls 91 that laterally extend along a first horizontal direction hd1 and the second-type deep trenches 9B have second lengthwise sidewalls 92 that laterally extend along a second horizontal direction hd2 that is different from the first horizontal direction hd1, and wherein clusters 90A of subsets of the first-type deep trenches 9A and clusters 90B of subsets of the second-type deep trenches 9B laterally alternating along at least one direction that is selected from the first horizontal direction hd1 and the second horizontal direction hd2; and a capacitor structure 300 comprising a layer stack 30 including at least three metallic electrode layers (10A, 10B, 20A, 20B) interlaced with at least two node dielectric layers 15, wherein each layer within the layer stack 30 comprises a horizontally-extending portion that overlies a top surface of the substrate 8 and vertically-extending portions that protrude downward into a respective one of the first-type deep trenches 9A and second-type deep trenches 9B.

In one embodiment, the first-type deep trenches 9A and the second-type deep trenches 9B comprise a two-dimensional array of deep trenches 9 in which the first-type deep trenches 9A are arranged as a first two-dimensional periodic array and the second-type deep trenches 9B are arranged as a second two-dimensional periodic array that is interlaced with the first two-dimensional periodic array, and wherein each of the first two-dimensional periodic array and the second two-dimensional periodic array has a first periodic pitch P1 along the first horizontal direction hd1 and has a second periodic pitch P2 along the second horizontal direction hd2.

In one embodiment, the semiconductor structure comprises stress-relief structures 400 located at corner regions of the two-dimensional array of deep trenches 9, wherein each of the stress-relief structures 400 comprises: a respective set of at least one additional deep trench 19 vertically extending within the substrate 8; and a respective additional layer stack 30 including at least three metallic material layers (10A, 10B, 20A, 20B) interlaced with at least two node dielectric layers 15.

In one embodiment, each of the metallic material layers (10A, 10B, 20A, 20B) within the stress-relief structures 400 is electrically isolated from the at least three metallic electrode layers (10A, 10B, 20A, 20B) within the capacitor structure 300. In one embodiment, the stress-relief structures 400 comprises four stress-relief structures 400 arranged with a mirror symmetry about a vertical plane (VP1 or VP2) passing through a geometrical center GC of the two-dimensional array of deep trenches 9.

In one embodiment, the second horizontal direction hd2 is perpendicular to the first horizontal direction hd1. In one embodiment, each of the at least one additional deep trench 19 comprises a tilted linear segment TLS that laterally extends along a respective horizontal direction that is at an angle greater than 0 degree and is less than 90 degrees with respective to the first horizontal direction hd1 as illustrated in FIGS. 7 and 8.

In one embodiment, each of the at least one additional deep trench 19 comprises: a first linear segment LS1 that is adjoined to the tilted linear segment LS and laterally extending along the first horizontal direction hd1, and a second linear segment LS2 laterally extending along the second horizontal direction hd2 as illustrated in FIGS. 7 and 9. In one embodiment, the second linear segment LS2 may be adjoined to the tilted linear segment TLS as illustrated in FIG. 7.

In one embodiment, the respective set of at least one additional deep trench 19 comprises a respective two-dimensional array of additional deep trenches 19 having a first periodicity P1 along the first horizontal direction hd1 and having a second periodicity P2 along the second horizontal direction hd2.

In one embodiment, each of the first-type deep trenches 9A and the second-type deep trenches 9B has a length-to-width ratio in a range from 3 to 30; each of the first-type deep trenches 9A and the second-type deep trenches 9B has a depth-to-width ratio in a range from 10 to 200; and each of the first-type deep trenches 9A and the second-type deep trenches 9B has a depth in a range from 2 micron to 20 microns.

In one embodiment, the at least three metallic electrode layers (10A, 10B, 20A, 20B) comprise a conductive metallic nitride, an elemental metal, or an intermetallic alloy; the at least two node dielectric layers 15 comprise a dielectric metal oxide or silicon nitride; and the substrate 8 comprises a semiconductor substrate.

In one embodiment, the semiconductor structure comprises: a contact-level dielectric layer 70 overlying capacitor structure 300; and contact via structures (80A, 80B) vertically extending through the contact-level dielectric layer 70 and contacting a respective one of the at least three metallic electrode layers (10A, 10B, 20A, 20B).

According to another aspect of the present disclosure, a semiconductor structure comprising a first semiconductor die 1000 is provided. The first semiconductor die 1000 comprise a substrate 8 and a deep trench capacitor 300 embedded within the substrate 8. The deep trench capacitor 300 comprises: a two-dimensional array of deep trenches 9 that contains a first two-dimensional periodic array of first-type deep trenches 9A located in the substrate 8 and a second two-dimensional periodic array of second-type deep trenches 9B that is located in the substrate 8 and is interlaced with the first two-dimensional periodic array, wherein the first-type deep trenches 9A have first lengthwise sidewalls 91 that laterally extend along a first horizontal direction hd1 and the second-type deep trenches 9B have second lengthwise sidewalls 92 that laterally extend along a second horizontal direction hd2 that is different from the first horizontal direction hd1; and a layer stack 30 including at least three metallic electrode layers (10A, 10B, 20A, 20B) interlaced with at least two node dielectric layers 15, wherein each layer within the layer stack 30 comprises a horizontally-extending portion that overlies a top surface of the substrate 8 and vertically-extending portions that protrude downward into a respective one of the first-type deep trenches 9A and second-type deep trenches 9B.

In one embodiment, the semiconductor structure comprises g a second semiconductor die 2000 that is bonded to the first semiconductor die 1000 and comprising semiconductor devices therein, wherein the deep trench capacitor 300 is electrically connected to the semiconductor devices through bonding pads or solder material portions.

In one embodiment, the first semiconductor die 1000 comprises stress-relief structures 400 located at corner regions of the two-dimensional array of deep trenches 9. In one embodiment, each of the stress-relief structures 400 comprises: a respective set of at least one additional deep trench 19 vertically extending within the substrate 8, and a respective additional layer stack 30 including at least three metallic material layers (10A, 10B, 20A, 20B) interlaced with at least two node dielectric layers 15.

Figure 12:
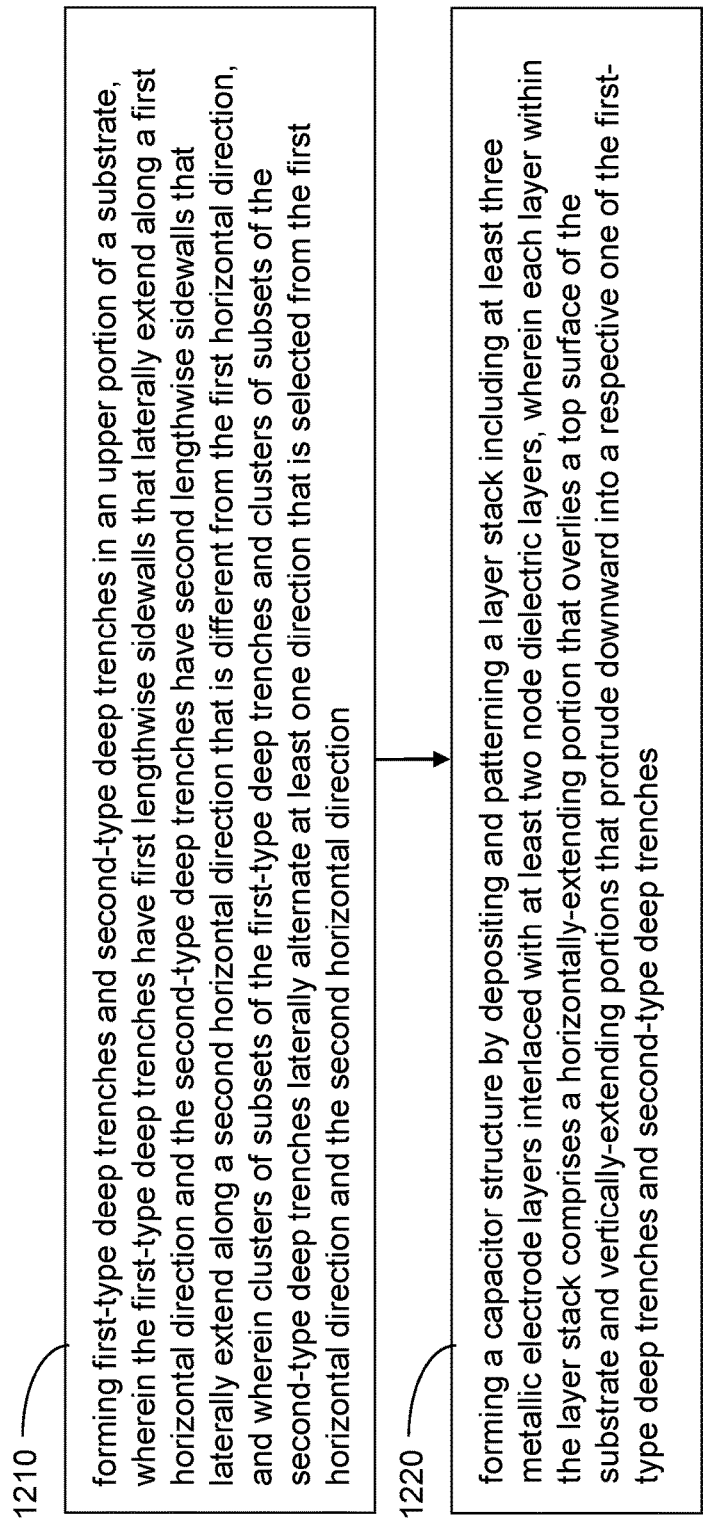
FIG. 12 is a flowchart that illustrates the general processing steps of the methods of the present disclosure.

FIG. 12 is a flowchart that illustrates the general processing steps of the methods of the present disclosure. Referring to step 1210 and FIGS. 1-10, first-type deep trenches 9A and second-type deep trenches 9B may be formed in an upper portion of a substrate 8. The first-type deep trenches 9A have first lengthwise sidewalls 91 that laterally extend along a first horizontal direction hd1 and the second-type deep trenches 9B have second lengthwise sidewalls 92 that laterally extend along a second horizontal direction hd2 that is different from the first horizontal direction hd1. Clusters 90A of subsets of the first-type deep trenches 9A and clusters 90B of subsets of the second-type deep trenches 9B laterally alternate along at least one direction that is selected from the first horizontal direction hd1 and the second horizontal direction hd2.

Referring to step 1220 and FIGS. 1-10, a capacitor structure 300 may be formed by depositing and patterning a layer stack 30 including at least three metallic electrode layers (10A, 10B, 20A, 20B) interlaced with at least two node dielectric layers 15. Each layer within the layer stack 30 comprises a horizontally-extending portion that overlies a top surface of the substrate 8 and vertically-extending portions that protrude downward into a respective one of the first-type deep trenches 9A and second-type deep trenches 9B.

The various embodiments of the present disclosure provide deformation-resistant deep trench capacitors 300 by providing a laterally alternating sequence of deep trenches having different lengthwise directions. Further, the stress-relief structures 400 may be formed around the deep trench capacitor 300. The stress-relief structures 400 may absorb mechanical stress to prevent warpage during handling of a first semiconductor die 1000 that includes the deep trench capacitor 300 such as bonding of the first semiconductor die 1000 to a second semiconductor die 2000.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
 a substrate comprising first-type deep trenches and second-type deep trenches therein, wherein the first-type deep trenches comprise first lengthwise sidewalls that laterally extend along a first horizontal direction and the second-type deep trenches comprise second lengthwise sidewalls that laterally extend along a second horizontal direction that is different from the first horizontal direction, and wherein clusters of subsets of the first-type deep trenches and clusters of subsets of the second-type deep trenches laterally alternate along at least one direction that is selected from the first horizontal direction and the second horizontal direction;
 a capacitor structure comprising a layer stack including at least three metallic electrode layers interlaced with at least two node dielectric layers, wherein each layer within the layer stack comprises a horizontally-extending portion that overlies a top surface of the substrate and vertically-extending portions that protrude downward into a respective one of the first-type deep trenches and second-type deep trenches; and
 stress-relief structures located at corner regions of the two-dimensional array of deep trenches, wherein each of the stress-relief structures comprises:
  a respective set of at least one additional deep trench vertically extending within the substrate; and
  a respective additional layer stack including at least three additional metallic material layers interlaced with at least two additional node dielectric layers and comprising at least one vertically-extending portion that vertically extends into a respective one of the at least one additional deep trench and a horizontally-extending portion that overlies a top surface of the substrate.

2. The semiconductor structure of claim 1, wherein the first-type deep trenches and the second-type deep trenches comprise a two-dimensional array of deep trenches in which the first-type deep trenches are arranged as a first two-dimensional periodic array and the second-type deep trenches are arranged as a second two-dimensional periodic array that is interlaced with the first two-dimensional periodic array, and wherein each of the first two-dimensional periodic array and the second two-dimensional periodic array has a first periodic pitch along the first horizontal direction and has a second periodic pitch along the second horizontal direction.

3. The semiconductor structure of claim 1, wherein each of the metallic material layers within the stress-relief structures is electrically isolated from the at least three metallic electrode layers within the capacitor structure.

4. The semiconductor structure of claim 1, wherein the stress-relief structures comprises four stress-relief structures arranged with a mirror symmetry about a vertical plane passing through a geometrical center of the two-dimensional array of deep trenches.

5. The semiconductor structure of claim 1, wherein:
 the second horizontal direction is perpendicular to the first horizontal direction; and
 each of the at least one additional deep trench comprises a tilted linear segment that laterally extends along a respective horizontal direction that is at an angle greater than 0 degree and is less than 90 degrees with respective to the first horizontal direction.

6. The semiconductor structure of claim 5, wherein each of the at least one additional deep trench comprises:
- a first linear segment that is adjoined to the tilted linear segment and laterally extending along the first horizontal direction; and
- a second linear segment that is adjoined to the tilted linear segment and laterally extending along the second horizontal direction.

7. The semiconductor structure of claim 1, wherein:
- the second horizontal direction is perpendicular to the first horizontal direction; and
- each of the at least one additional deep trench comprises a first linear segment laterally extending along the first horizontal direction and a second linear segment that is adjoined to the first linear segment and laterally extending along the second horizontal direction.

8. The semiconductor structure of claim 1, wherein the respective set of at least one additional deep trench comprises a respective two-dimensional array of additional deep trenches having a first periodicity along the first horizontal direction and having a second periodicity along the second horizontal direction.

9. The semiconductor structure of claim 1, wherein:
- each of the first-type deep trenches and the second-type deep trenches has a length-to-width ratio in a range from 3 to 30;
- each of the first-type deep trenches and the second-type deep trenches has a depth-to-width ratio in a range from 10 to 200; and
- each of the first-type deep trenches and the second-type deep trenches has a depth in a range from 2 micron to 20 microns.

10. The semiconductor structure of claim 1, wherein:
- the at least three metallic electrode layers comprise a conductive metallic nitride, an elemental metal, or an intermetallic alloy;
- the at least two node dielectric layers comprise a dielectric metal oxide or silicon nitride; and
- the substrate comprises a semiconductor substrate.

11. The semiconductor structure of claim 1, further comprising:
- a contact-level dielectric layer overlying capacitor structure; and
- contact via structures vertically extending through the contact-level dielectric layer and contacting a respective one of the at least three metallic electrode layers.

12. The semiconductor structure of claim 1, wherein each of the at least three additional metallic material layers has a same material composition and a same thickness as a respective one of the at least three metallic electrode layers in the layer stack of the capacitor structure, and wherein each of the at least two additional node dielectric layers has a same material composition and a same thickness as a respective one of the at least two node layers in the layer stack of the capacitor structure.

13. A semiconductor structure comprising a first semiconductor die, wherein:
- the first semiconductor die comprise a substrate and a deep trench capacitor embedded within the substrate; and
- the deep trench capacitor comprises:
  - a two-dimensional array of deep trenches that contains a first two-dimensional periodic array of first-type deep trenches located in the substrate and a second two-dimensional periodic array of second-type deep trenches that is located in the substrate and is interlaced with the first two-dimensional periodic array, wherein the first-type deep trenches have first lengthwise sidewalls that laterally extend along a first horizontal direction and the second-type deep trenches have second lengthwise sidewalls that laterally extend along a second horizontal direction that is different from the first horizontal direction;
  - a layer stack including at least three metallic electrode layers interlaced with at least two node dielectric layers, wherein each layer within the layer stack comprises a horizontally-extending portion that overlies a top surface of the substrate and vertically-extending portions that protrude downward into a respective one of the first-type deep trenches and second-type deep trenches; and
  - stress-relief structures located at corner regions of the two-dimensional array of deep trenches, wherein each of the stress-relief structures comprises:
    - a respective set of at least one additional deep trench vertically extending within the substrate; and
    - a respective additional layer stack including at least three additional metallic material layers interlaced with at least two additional node dielectric layers and comprising at least one vertically-extending portion that vertically extends into a respective one of the at least one additional deep trench and a horizontally-extending portion that overlies a top surface of the substrate.

14. The semiconductor structure of claim 13, further comprising a second semiconductor die that is bonded to the first semiconductor die and comprising semiconductor devices therein, wherein the deep trench capacitor is electrically connected to the semiconductor devices through bonding pads or solder material portions.

15. The semiconductor structure of claim 13, wherein each of the at least three additional metallic material layers has a same material composition and a same thickness as a respective one of the at least three metallic electrode layers in the layer stack of the capacitor structure, and wherein each of the at least two additional node dielectric layers has a same material composition and a same thickness as a respective one of the at least two node layers in the layer stack of the capacitor structure.

16. A semiconductor structure comprising:
- a substrate comprising a plurality of first deep trenches laterally offset inward from sidewalls of the substrate and a plurality of second deep trenches that are proximal to the sidewalls of the substrate, wherein each of the second deep trenches comprises a first linear segment that laterally extends along a first horizontal direction, a second linear segment that laterally extends along a second horizontal direction that is perpendicular to the first horizontal direction, and a tilted linear segment connecting the first linear segment and the second linear segment and tilted relative to the first horizontal direction by an angle greater than 0 degree and less than 90 degrees;
- a capacitor structure comprising a first layer stack including at least three metallic electrode layers interlaced with at least two node dielectric layers, wherein each layer within the first layer stack comprises a horizontally-extending portion that overlies a top surface of the substrate and vertically-extending portions that protrude downward into a respective one of the first deep trenches; and
- a stress-relief structure comprising a second layer stack including at least three additional metallic electrode layers interlaced with at least two additional node dielectric layers, wherein each layer within the second layer stack comprises a horizontally-extending portion that overlies the top surface of the substrate and vertically-extending portions that protrude downward into a respective one of the second deep trenches, wherein each of the at least three additional metallic material layers has a same material composition and a same thickness as a respective one of the at least three metallic electrode layers in the first layer stack of the capacitor structure, and wherein each of the at least two additional node dielectric layers has a same material composition and a same thickness as a respective one of the at least two node layers in the first layer stack of the capacitor structure.

17. The semiconductor structure of claim 16, wherein a portion of the first layer stack that overlies the top surface of the substrate comprises a stepped surface region including stepped surfaces such that, for each pair of an overlying metallic electrode layer and an underlying metallic electrode layer within the first layer stack, the overlying metallic electrode layer has a lesser lateral extent than the underlying metallic electrode layer in the stepped surface region.

18. The semiconductor structure of claim 17, wherein each sidewall of the second layer stack located above the top surface of the substrate comprises a respective set of sidewalls of each layer within the second layer stack that are vertically coincident among one another.

19. The semiconductor structure of claim 16, wherein each of the additional metallic material layers within the stress-relief structure is electrically isolated from the at least three metallic electrode layers within the capacitor structure.

20. The semiconductor structure of claim 16, wherein:
the semiconductor structure comprises four stress-relief structures including the stress-relief structures and three additional stress-relief structures; and
the four stress-relief structures are arranged with a mirror symmetry about a vertical plane passing through a geometrical center of the capacitor structure.

* * * * *